(12) United States Patent
Murai (10) Patent No.: US 6,494,567 B2
(45) Date of Patent: Dec. 17, 2002

(54) PIEZOELECTRIC ELEMENT AND MANUFACTURING METHOD AND MANUFACTURING DEVICE THEREOF

(75) Inventor: Masami Murai, Nagano (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/812,847

(22) Filed: Mar. 21, 2001

(65) Prior Publication Data

US 2002/0008743 A1 Jan. 24, 2002

(30) Foreign Application Priority Data

Mar. 24, 2000 (JP) .................................... 2000-083970
Jun. 9, 2000 (JP) .................................... 2000-173609

(51) Int. Cl.[7] ................................................ B41J 2/45
(52) U.S. Cl. ........................................................ 347/71
(58) Field of Search ..................... 347/71, 68; 310/330, 310/358

(56) References Cited

U.S. PATENT DOCUMENTS 6,198,208 B1 * 3/2001 Yano et al. ................. 310/358

FOREIGN PATENT DOCUMENTS

JP  8-335676    12/1996
JP  10-81016     3/1998

* cited by examiner

*Primary Examiner*—Thinh Nguyen
(74) *Attorney, Agent, or Firm*—Sterne, Kessler, Goldstein & Fox P.L.L.C.

(57) ABSTRACT

By setting the thickness of the Ti core between 4~6 nm and adjusting the thickness ratio of the Pt layer in relation to the thickness of the entire lower electrode, the (100) face orientation degree of a piezoelectric thin film may be set to a prescribed ratio with favorable reproducibility. Preferably, the (100) face orientation degree of the piezoelectric thin film is not less than 40% and not more than 70% or less, the (110) face orientation degree is 10% or less, and the (111) face orientation degree is the remaining portion thereof. Further, by applying heat from the lower electrode side upon calcinating the piezoelectric precursor film, it is possible to obtain satisfactory crystallinity as the crystal growth begins from the lower electrode side and reaches the upper part of the film. Accordingly, piezoelectric properties of the piezoelectric thin film are improved, and a highly reliable inkjet recording head and printer may be obtained thereby.

20 Claims, 8 Drawing Sheets

PIEZOELECTRIC ELEMENT AND MANUFACTURING METHOD AND MANUFACTURING DEVICE THEREOF

BACKGROUND OF THE INVENTION

1. Field of the Invention

The present invention generally relates to a piezoelectric element with an electromechanical conversion function, and particularly to a piezoelectric element capable of acquiring superior piezoelectric properties upon being used in an inkjet recording head, and the manufacturing method and manufacturing device of an inkjet recording head, printer, and piezoelectric element.

2. Description of the Related Art

A typical inkjet recording head uses a piezoelectric element as the driving force to discharge ink from a printer. In general, this piezoelectric element is structured by comprising a piezoelectric thin film, and an upper electrode and lower electrode arranged so as to sandwich such piezoelectric thin film.

Conventionally, piezoelectric elements have been developed in pursuit of improving properties by defining the crystal structure of the film made from lead zirconate titanate (PZT), or forming a Ti core on the lower electrode. For example, Japanese Patent Application Laid-Open No. 10-81016 discloses a PZT thin film comprising a crystal structure of a rhombohedral crystal system as well as a prescribed orientation degree. Moreover, Japanese Patent Application Laid-Open No. 8-335676 discloses a piezoelectric element wherein a titanium core is formed on an Ir lower electrode.

Nevertheless, with conventional piezoelectric elements, there is a problem in that it is difficult to obtain a prescribed orientation degree of a piezoelectric element in a stable manner and with favorable reproducibility. With this type of piezoelectric element, it is difficult to obtain stable and superior piezoelectric properties, which becomes a contributing factor for not being able to obtain sufficient printing performance from inkjet recording heads and printers.

Meanwhile, for the manufacture of a piezoelectric element described above, a piezoelectric element with a perovskite crystal structure is formed by layering amorphous films containing metallic elements constituting the piezoelectric material, and crystallizing this by calcination at a temperature of, for example, 600° C. with a diffusion furnace or a rapid thermal annealing (RTA) device, for example.

Pursuant to the aforementioned heat treatment, it is known that the crystal orientation of the produced piezoelectric thin film is affected by the substrate that becomes the base upon forming the piezoelectric thin film, or by the crystal direction of the lower electrode.

However, although a desired crystal orientation can be obtained in the vicinity of the lower electrode of the piezoelectric thin film with the aforementioned conventional technology, crystallinity at portions distant from the lower electrode; in other words, the upper part of the piezoelectric thin film, was apt to be poor. Particularly, when a film is formed with a thickness of 0.5 μm or more, there is a problem in that the piezoelectric properties become inferior as the depreciation of the crystallinity at the upper part of the film becomes prominent.

Furthermore, there is another problem in that the displacement efficiency of the actuator becomes inferior as distortion is distributed in the film-thickness direction.

SUMMARY OF THE INVENTION

An object of the present invention is to overcome the aforementioned problems and provide a piezoelectric element comprising stable and superior piezoelectric properties by obtaining a prescribed orientation degree of a piezoelectric thin film in a stable manner and with favorable reproducibility.

Another object of the present invention is to provide a method for manufacturing a piezoelectric element with superior crystallinity and in which the crystal orientation thereof is uniform in the film-thickness direction.

A further object of the present invention is to provide an inkjet recording head employing the aforementioned piezoelectric element as the driving force for discharging ink, a manufacturing method of such inkjet recording head, and an inkjet printer.

In order to achieve the aforementioned objects, the present invention is a manufacturing method of a piezoelectric element; comprising the steps of: forming a $ZrO_2$ film on a substrate; forming a lower electrode on the $ZrO_2$ film; forming a Ti layer having a thickness of not less than 4 nm and not more than 6 nm on the lower electrode; forming a piezoelectric precursor film on the Ti layer; and calcinating the obtained structure;

(1) wherein the lower electrode comprises at least a first layer positioned as the uppermost layer and containing Ir and a second layer positioned as the second uppermost layer and containing Pt; the thickness of the second layer is not less than 30% and not more than 50% of the thickness of the entire lower electrode; and the step for forming the lower electrode comprises at least a step of forming the second layer containing Pt and a step of forming the first layer containing Ir on the second layer; or (2) wherein the lower electrode comprises at least a first layer positioned as the uppermost layer and containing Pt and a second layer positioned as the second uppermost layer and containing Ir; the thickness of the first layer is not less than 20% and not more than 40% of the thickness of the entire lower electrode; and the step for forming the lower electrode comprises at least a step of forming the second layer containing Ir and a step of forming the first layer containing Pt on the second layer.

Moreover, the piezoelectric element according to the present invention comprises: a lower electrode formed on a $ZrO_2$ film; a piezoelectric thin film formed on the lower electrode; and an upper electrode formed on the piezoelectric thin film; wherein the (100) face orientation degree of the piezoelectric thin film measured with the X-ray diffraction angle method is not less than 40% and not more than 70%.

Furthermore, preferably, the (110) face orientation degree is 10% or less, and the (111) face orientation degree is the remaining portion thereof.

Figure 9:
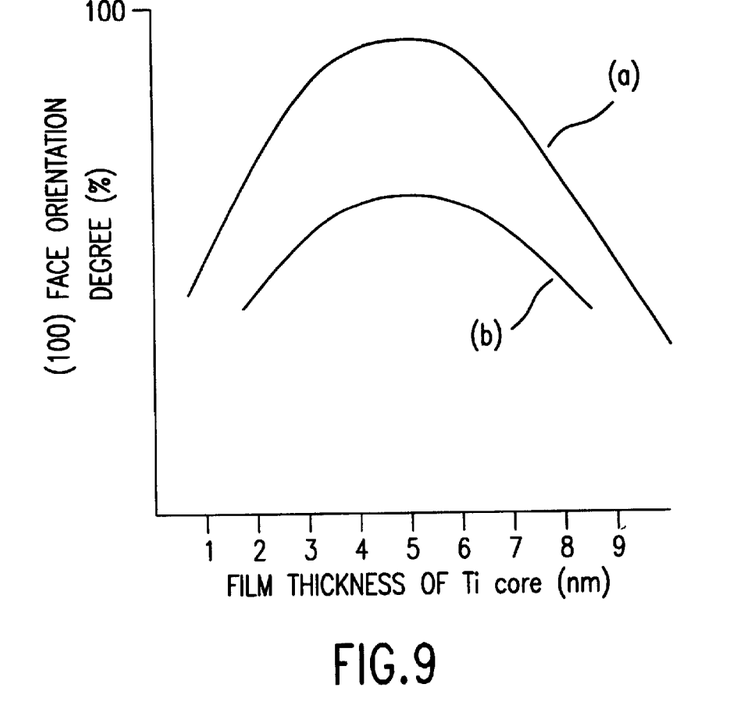
FIG. 9 is a diagram showing the relationship between the (100) face orientation degree and the thickness of the Ti core.

FIG. 9 is a diagram showing the results upon measuring the relationship of a (100) face orientation degree of the piezoelectric thin film and the thickness of the Ti core with respect to a piezoelectric element obtained by forming a lower electrode in which an Ir layer, Pt layer, and Ir layer are laminated in that order on a $ZrO_2$ film, forming a Ti core, and further forming a piezoelectric precursor film and crystallizing the obtained structure. In FIG. 9, symbol (a) illustrates the case where the thickness of the second layer of the lower electrode containing Pt is approximately 10% in relation to the thickness of the entire lower electrode. Here, when the thickness of the Ti core is not less than 4 nm and not more than 6 nm, the (100) face orientation degree may be enhanced to approximately 90%. If the (100) face orientation degree is adjusted to any other value than as described above, however, the variance of the (100) face orientation degree in relation to the change in thickness of the Ti core will be too large, and a desired (100) face orientation degree can not be obtained in a stable manner and with favorable reproducibility.

Contrarily, symbol (b) in FIG. 9 represents a case where the ratio of the thickness of the second layer of the lower electrode containing PT in relation to the thickness of the entire lower electrode is increased in comparison to example (a) above. Here, the (111) face orientation degree of the piezoelectric thin film rises due to the influence of Pt and, when the thickness of the Ti core is not less than 4 nm and not more than 6 nm, the (100) face orientation degree shows a stable value.

As described above, by setting the thickness of the Ti core between 4 nm and 6 nm and adjusting the thickness ratio of the Pt layer in relation to the thickness of the entire lower electrode, the (100) face orientation degree (ratio of the (100) face orientation degree in relation to the (111) face orientation degree) of a piezoelectric thin film may be set to a prescribed ratio with favorable reproducibility.

Thus, according to the present invention, it is possible to obtain a (100) face orientation degree of a piezoelectric thin film in a stable manner and with favorable reproducibility. In addition, the ratio of the (100) face orientation degree in relation to the (111) face orientation degree may also be obtained with favorable reproducibility. It is therefore possible to provide a piezoelectric element comprising stable and high piezoelectric properties in both high frequencies and low frequencies.

Furthermore, the present invention is a manufacturing method of a piezoelectric element; comprising the steps of: forming on a lower electrode an amorphous film containing metallic elements and oxygen elements constituting a piezoelectric material; and forming a piezoelectric thin film crystallized by subjecting the amorphous film to a heat treatment; wherein during the heat treatment, heat is applied from the lower electrode side.

During the aforementioned heat treatment, the thermal energy supplied from the lower electrode side to the amorphous film is greater than the thermal energy supplied from the opposite side of the lower electrode.

The present invention also relates to a heating device realizing the heating methods described above.

Another embodiment of the piezoelectric element according to the present invention comprises a PZT thin film, and the (100) face half value breadth of the PZT thin film measured with the X-ray diffraction angle method is 0.2 degrees or less.

According to the present invention, as the substrate and heating element are arranged such that the radiant heat of the heating device is applied to the lower electrode side when heat treating and crystallizing an amorphous film containing metallic elements and oxygen elements constituting a piezoelectric material, heat is applied from the lower electrode side, and the crystal growth of the piezoelectric thin film begins from the lower electrode side and reaches the upper part of the film. It is thereby possible to manufacture a piezoelectric element with favorable piezoelectric properties as it possesses superior crystallinity and the crystal orientation is uniform in the film-thickness direction.

An inkjet recording head employing the aforementioned piezoelectric element or a printer utilizing such inkjet recording head is capable of achieving superior printing quality.

DESCRIPTION OF THE PREFERRED EMBODIMENTS

The preferred embodiments of the present invention are now described with reference to the relevant drawings.

First Embodiment

Figure 1:
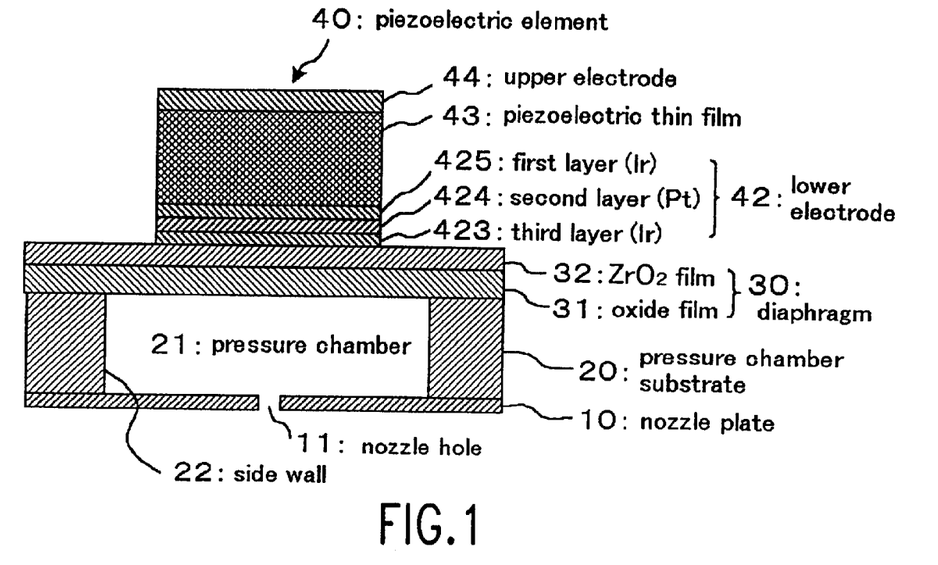
FIG. 1 is a cross section of a piezoelectric element according to the first embodiment.

FIG. 1 is a cross section showing the layer structure in which the piezoelectric element portion of the inkjet recording head according to the present embodiment is enlarged.

As illustrated in FIG. 1, the piezoelectric element 40 is constructed by successively laminating a $ZrO_2$ film 32, a lower electrode 42, a piezoelectric thin film 43 and an upper electrode 44 on an oxide film 31.

The oxide film 31 is formed on a pressure chamber substrate 20 made from a monocrystal silicon having a thickness of, for example, 220 $\mu$m. Preferably, the oxide film 31 is obtained by forming a film made from silicon oxide ($SiO_2$) into a thickness of 1.0 $\mu$m.

The $ZrO_2$ film 32 is a layer with elasticity and, together with the oxide film 31, constitutes the diaphragm. As this $ZrO_2$ film 32 has a function of providing elasticity, preferably, the thickness thereof is not less than 200 nm and not more than 800 nm.

It is possible to provide, between the $ZrO_2$ film 32 and the lower electrode 42, an adhesive layer (not shown) made from metal, preferably titanium or chrome, capable of adhering the two layers. This adhesive layer is formed in order to improve the adhesion of the piezoelectric element and the face to which it is to be placed, and is not necessary if such adhesion can be secured. When providing an adhesive layer, preferably, the thickness thereof should be 10 nm or more.

The lower electrode 42 is composed of a third layer 423 positioned as the lowermost layer and containing Ir; a second layer 424 having a thickness of not less than 30% and not more than 50% in relation to the thickness of the lower electrode 42, and containing Pt; and a first layer 425 positioned as the uppermost layer and containing Ir. There is no particular limitation as to the thickness of the entire lower electrode 42, and, for example, may be set to 100 nm. Moreover, when the thickness of the adhesive layer prior to calcination is d0, the thickness of the third layer 423 is d1, the thickness of the second layer is d2, the thickness of the first layer is d1, and the thickness of the entire lower electrode after calcination is dT, it is preferable that the relationship of:

$$dT=3.6 \times d0+2.4 \times d1+0.8 \times d2+2.3 \times d3$$

is satisfied.

A Ti core layer (not shown) is formed on the lower electrode 42. The thickness of the Ti core layer is less than 4 nm and not more than 6 nm.

The piezoelectric thin film 43 is a ferroelectric substance composed of ordinary piezoelectric ceramics, and, preferably, is made from ferroelectric piezoelectric material such as lead zirconate titanate (PZT), or material in which metal oxides such as niobium oxide, nickel oxide or magnesium oxide is added thereto. The composition of the piezoelectric thin film 43 may be suitably selected in consideration of the properties, usage, and so on of the piezoelectric element. In particular, preferably used are lead titanate ($PbTiO_3$), lead zirconate titanate ($Pb(Zr,Ti)O_3$), lead zirconium oxide ($PbZrO_3$), lead-lanthanum titanate (($Pb,La),TiO_3$), lead-lanthanum zirconate titanate (($Pb,La)(Zr,Ti)O_3$), or lead zirconate titanate magnesium niobium oxide ($Pb(Zr,Ti)(Mg,Nb)O_3$). Moreover, a film having superior piezoelectric properties can be obtained by suitably adding niobium (Nb) to lead titanate or lead zirconium acid.

The (100) face orientation degree of the piezoelectric thin film 43 measured with the X-ray diffraction angle method is not less than 40% and not more than 70%. Further, the (110) face orientation degree is 10% or less, and the (111) face orientation degree is the remaining portion thereof.

The thickness of the piezoelectric thin film 43 should be sufficiently thin such that cracks are not generated during the manufacturing process on the one hand, and sufficiently thick so as to yield substantial displacement properties on the other hand; for example, 1500 nm.

The upper electrode 44 is an electrode forming a counterpart with the lower electrode 42, and, preferably, is formed from Pt or Ir. The thickness of the upper electrode 44 is preferably around 50 nm.

Figure 4:
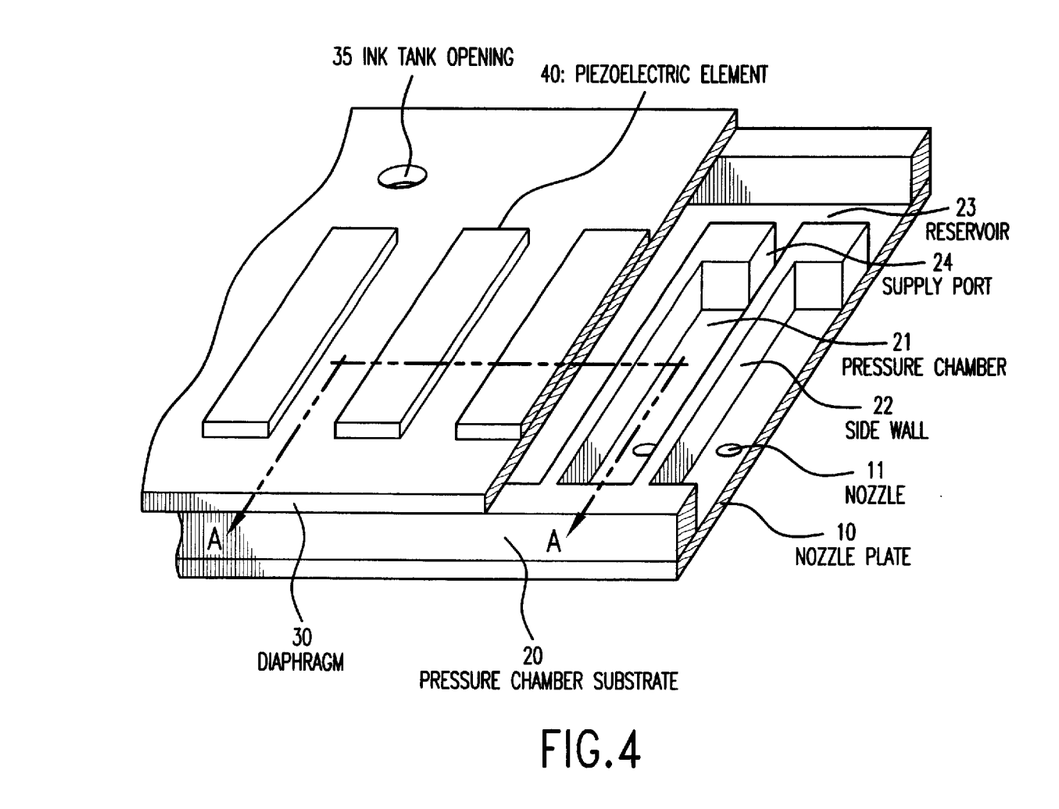
FIG. 4 is a perspective view with a partial cross section showing the construction of the principle components of an inkjet recording head.

FIG. 4 is a partial cross section of a perspective view showing the structure of the principle components of an inkjet recording head.

As illustrated in FIG. 4, an inkjet recording head is composed of a nozzle plate 10, a pressure chamber substrate 20, a diaphragm 30 and a piezoelectric element 40.

The pressure chamber substrate 20 comprises a pressure chamber (cavity) 21, a side wall 22, a reservoir 23 and a supply port 24. The pressure chamber 21 is formed as a void for storing ink to be discharged by etching a substrate made from silicon, etc. The side wall 22 if formed so as to partition the pressure chamber 21. The reservoir 23 acts as a flow channel for supplying and filling the ink in the respective pressure chambers 21. The supply port 24 is formed so as to be capable of introducing the ink form the reservoir 23 to the respective pressure chambers 21.

The nozzle plate 10 is attached to one face of the pressure chamber substrate 20 such that the nozzle 11 is positioned to correspond to the respective pressure chambers 21 provided to the pressure chamber substrate 20.

The diaphragm 30 is formed by laminating the oxide film 31 and the $ZrO_2$ film 32 as described above. The piezoelectric element 40 according to the present invention is provided as a piezoelectric actuator on the diaphragm 30. Piezoelectric elements 40 comprising the layered structure as illustrated in FIG. 1 are respectively positioned on the diaphragm 30 corresponding to the respective pressure chambers 21. An ink tank opening 35 is provided to the diaphragm 30 and allows the ink stored in an ink tank (not shown) to be supplied inside the pressure chamber substrate 20.

The pressure chamber substrate 20 provided with the nozzle plate 10 and diaphragm 30 is housed inside a housing (not shown), constituting the inkjet recording head.

In the aforementioned construction, when the piezoelectric element 40 becomes distorted by voltage being applied between the lower electrode 42 and the upper electrode 44 of the piezoelectric element 40, the diaphragm 30 is transformed in accordance with such distortion. Pursuant to this transformation, pressure is applied to the ink in the pressure chamber 21, and droplets of ink are thereby discharged from the nozzle 11.

Figure 5:
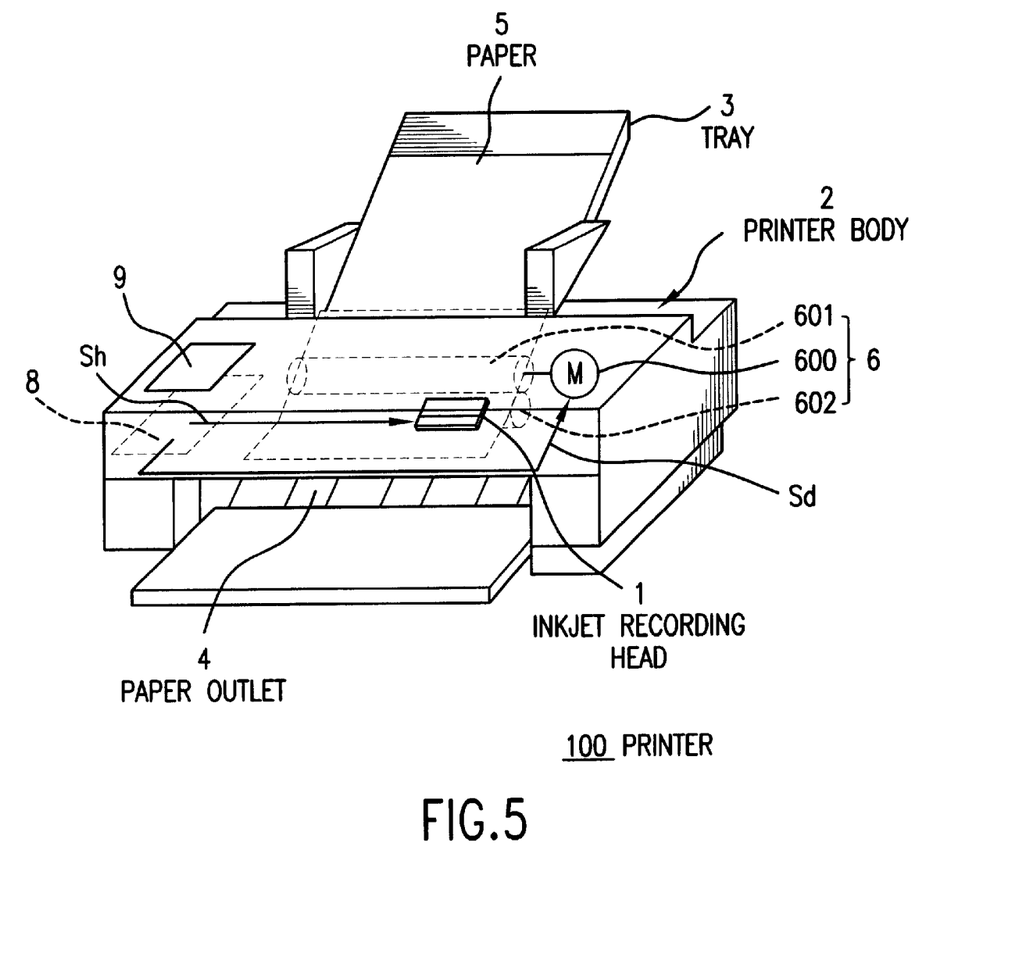
FIG. 5 is a perspective view showing the construction of a printer using the inkjet recording head according to the present invention.

FIG. 5 is a perspective view explaining the structure of the printer 100 according to the present embodiment. As shown in FIG. 5, the printer 100 comprises a printer body 2, which is provided with an inkjet recording head 1 of the present invention acting as a printing means, a tray 3, a paper outlet 4, a paper feed mechanism 6, a control circuit 8, an operation panel 9, and so on.

The tray 3 is constructed so as to be capable of supplying the paper 5 prior to printing to the paper feed mechanism 6. Pursuant to the control from the operation panel 9 or the print information supplied externally, the control circuit 8 outputs a paper feed signal Sd for making the paper feed mechanism 6 feed the paper 5 and a print signal Sh for making the inkjet recording head 1 conduct printing. The paper feed mechanism 6 is constituted by the rollers 601 and 602 for taking the paper 5 in and a motor 600 for driving such rollers, and is capable of taking the paper 5 inside the main body 2 based on the paper feed signal Sd. The inkjet recording head 1 is structured to be movable transversely across the paper 5 supplied by the paper feed mechanism 6 and, when the print signal Sh is supplied from the control circuit 8, is capable of printing on the paper 5 by the ink being discharged as a result of the transformation of the piezoelectric element 40. The paper outlet 4 is an outlet through which the printed paper 5 is output.

Manufacturing Method

Figure 6:
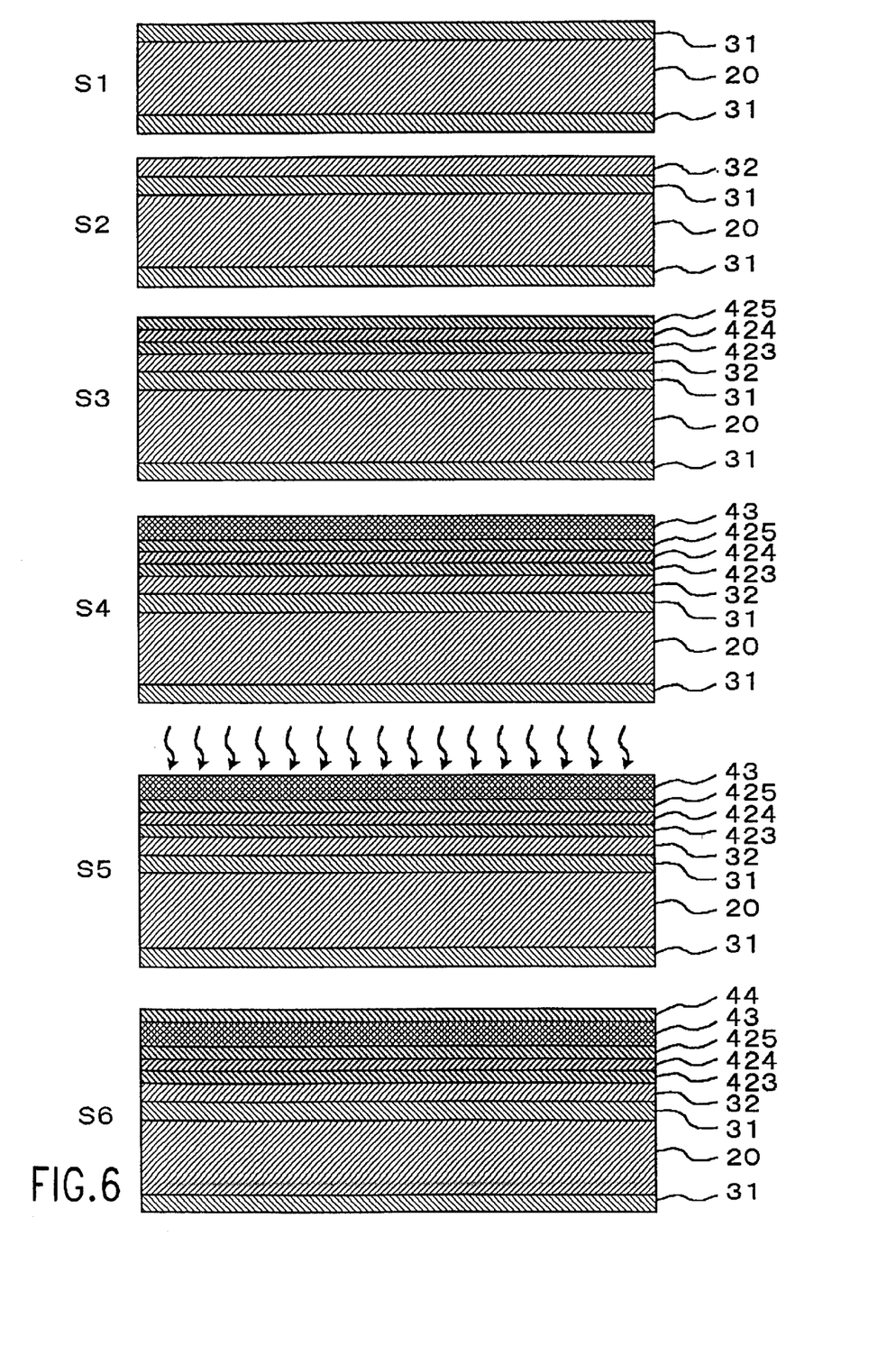
FIG. 6 is a schematic cross section showing a manufacturing method of the inkjet recording head according to the present invention.
Figure 7:
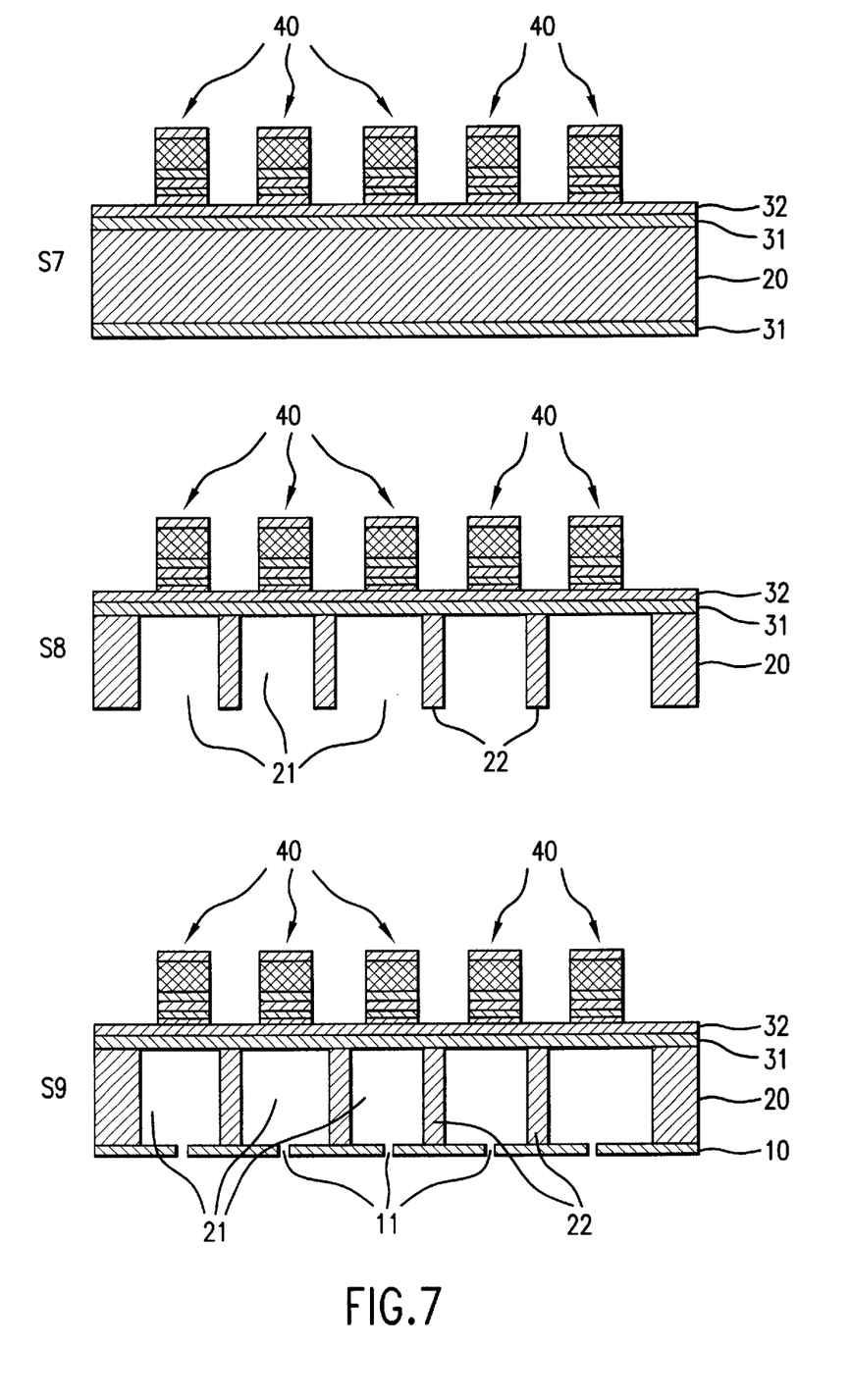
FIG. 7 is a schematic cross section showing a manufacturing method of the inkjet recording head according to the present invention.

The manufacturing method of the piezoelectric element according to the present invention is now explained. FIG. 6 and FIG. 7 are schematic cross sections showing a manufacturing method of the inkjet recording head according to the present invention.

Oxide Film Forming Step (S1)

In the first place, high temperature treatment is conducted to a silicon substrate 20 in an oxidation atmosphere containing oxygen or vapor in order to form an oxide film 31 made from silicon oxide ($SiO_2$). In addition to the thermal oxidation method generally used for this step, also used may be the CVD method. Moreover, as the insulation film 31, in addition to silicon dioxide, used may be a zirconium oxide film, a tantalum oxide film, a silicon nitride film, or an aluminum oxide film.

$ZrO_2$ Film Forming Step (S2)

$ZrO_2$ film 32 is formed on the oxide film 31 on the pressure chamber substrate 20. This $ZrO_2$ film 32 is obtained by forming a Zr layer by a sputtering method or a vacuum deposition method and conducting high temperature treatment thereto in an oxygen environment. As other methods of forming the film, employed may be a reactive sputtering method in which oxygen gas is introduced with Zr as the target, an RF sputtering method in which zirconium oxide is the target, or other like.

Lower Electrode Forming Step (S3)

First, a third layer 423 containing Ir is formed on the $ZrO_2$ film 32, then a second layer 424 containing Pt and having a thickness of not less than 30% and not more than 50% in relation to the thickness of the lower electrode 42 is formed on the third layer, and a first layer 425 containing Ir is thereafter formed on the second layer.

Each of the layers 423–425 are formed by employing the sputtering method and the like and adhering Ir or Pt, as the case may be, on the $ZrO_2$ film 32. In addition, prior to forming the lower electrode 42, an adhesion layer (not shown) made from titanium or chrome may be formed with the sputtering method or vacuum deposition method.

Ti Core (Layer) Forming Step

A titanium crystal (not shown) is formed on the lower electrode 42 with the likes of a sputtering method. The reason for forming a Ti core (layer) is in order to obtain a precise and columnar crystal by growing PZT with a titanium crystal as the core and making the crystal grow from the lower electrode side. In addition to the sputtering method for forming the titanium film, used may be a CVD method, a vacuum deposition method, and other film-forming methods.

Piezoelectric Precursor Film Forming Step (S4)

A piezoelectric precursor film 43' is formed with, for example, a sol-gel process. Specifically, sol made from an organic metal alkoxide solution is foremost applied on the Ti core with a spin-coating method and so on. Next, this is dried at a fixed temperature for a fixed length of time in order to vaporize the solution. After drying, this is further degreased at a prescribed high temperature for a fixed length of time under an atmospheric atmosphere, organic ligands coordinated to metal are pyrolytically decomposed, and made into metal oxide. The respective steps of application, drying, and degreasing are repeated a prescribed number of times, 4 times or more for example, in order to laminate 4 or more layers of the piezoelectric precursor film. Pursuant to these treatments of drying and degreasing, metal alkoxide and acetate in the solution form a network of metal, oxygen, and metal via the pyrolysis of ligands.

Calcination Step (S5)

The piezoelectric precursor film 43' is calcinated to crystallize the same. Pursuant to this calcination, the piezoelectric precursor film 43' becomes a piezoelectric thin film in which the (100) face orientation degree thereof measured with the X-ray diffraction angle method is not less than 40% and not more than 70% as a result of the perovskite crystal structure being formed from the precursor in an amorphous state and changing into a thin film representing electromechanical behavior. Although the calcination temperature will vary according to the material, calcination may be conducted at a temperature lower than the temperature required for the general calcination of metal oxide powder. In the present embodiment, 650° C. heat is applied for 5 to 30 minutes. As the heating device, used may be an RTA (Rapid Thermal Annealing) device, diffusion furnace, and the like.

Upper Electrode Forming Step (S6)

Finally, an upper electrode 44 is formed by forming a platinum (Pt) film on the piezoelectric thin film 43 with an electronic beam deposition method or a DC sputtering method.

Piezoelectric Element Forming Step (S7)

If the piezoelectric element 40 obtained in the aforementioned steps is manufactured by masking it into a suitable shape for its usage, and etching and fairing the periphery thereof in order to enable voltage to be applied between the upper and lower electrodes, it is possible to make it operate as the piezoelectric element of the present invention. Specifically, resist material is foremost applied on the upper electrode in a uniform thickness by employing the spinner method, spray method, or the like. Next, the mask is formed into the shape of the piezoelectric element and then exposed and developed, and a resist pattern is formed on the upper electrode 44. Thereafter, etching removal is conducted to the upper electrode 44 and the piezoelectric thin film 43 with the generally used methods of ion milling or dry etching, thereby forming the respective piezoelectric elements 40.

Pressure Chamber Forming Step (S8)

Next, on the face opposite to the face of the pressure chamber substrate where the piezoelectric element 40 was formed, etching and masking is conducted to the position where the ink chamber is to be formed, etching is conducted to the ink chamber substrate 20 to a predetermined deepness with an etching method such as anisotropic etching or parallel plate reactive etching which employs active gas, and a pressure chamber is formed thereby. The remaining non-etched portions become the side wall 22.

Nozzle Plate Adhesion Step (S9)

Finally, a nozzle plate 10 is adhered to the etched pressure chamber substrate 20 with an adhesive. The respective nozzles 11 are positioned such that they are arranged in the spaces in each of the pressure chambers 21 upon such adhesion. The pressure chamber substrate 20 with the nozzle plate 10 adhered thereto is mounted on the housing not shown, and an inkjet recording head 1 is completed thereby.

In addition to manufacturing several piezoelectric elements according to the manufacturing method of the aforementioned first embodiment by variously changing the ratio of the thickness of the Pt layer in relation to the thickness of the entire lower electrode, as comparative examples, several piezoelectric elements in ratios other than those described in the aforementioned embodiment were manufactured.

Figure 8:
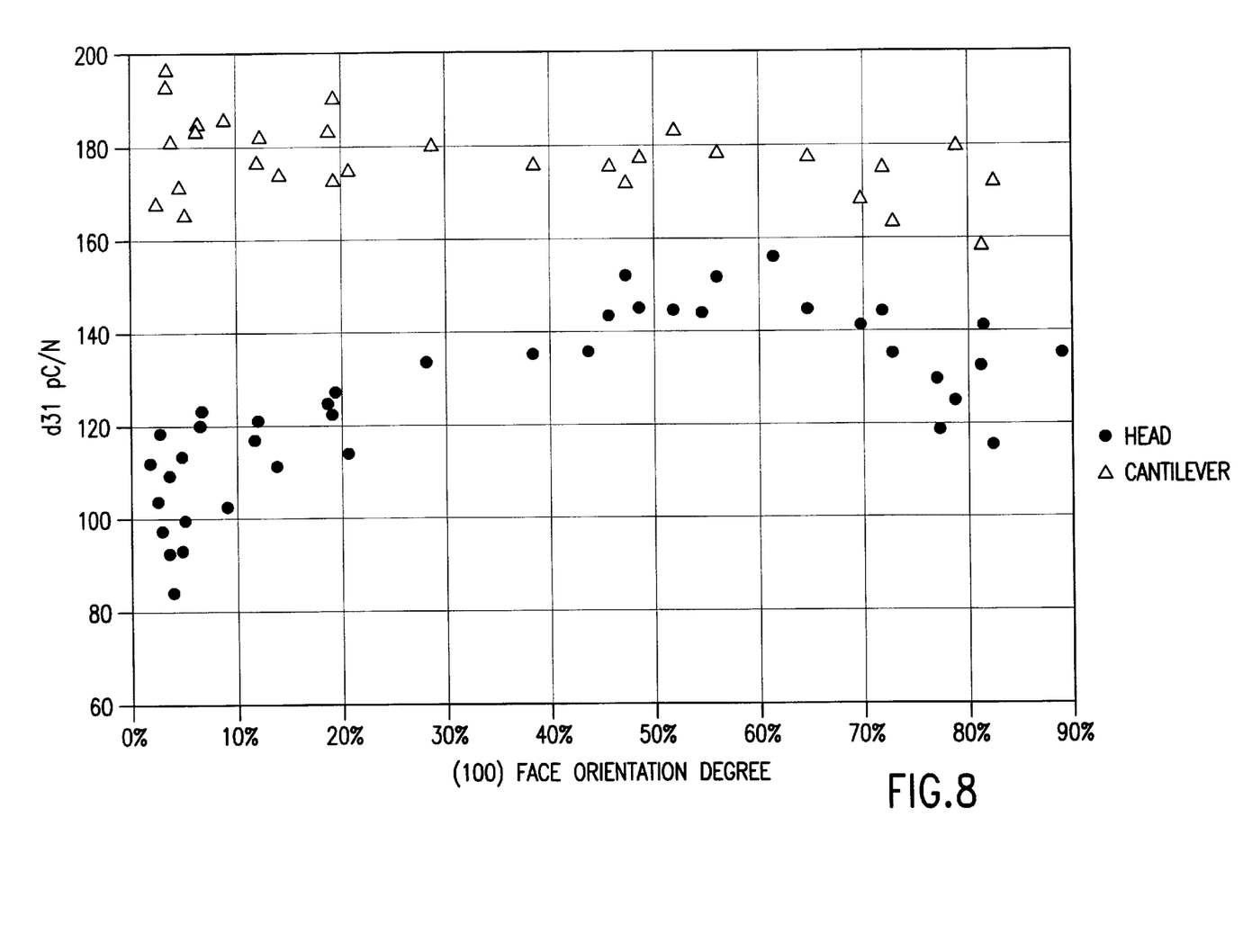
FIG. 8 is a diagram showing the relationship between the (100) face orientation degree and the piezoelectric constant d31.

FIG. 8 is a diagram showing the relationship between the (100) face orientation degree and the piezoelectric constant d31 regarding the piezoelectric element obtained as a result of the above. In particular, the piezoelectric constant d31 was measured in both a high frequency (14 kHz, measured with an inkjet head) and a low frequency (measured with a DC-driven cantilever). In FIG. 8, when the (100) face orientation degree is small, it represents that the (111) face orientation degree is large.

As illustrated in FIG. 8, the higher the (111) face orientation degree, the higher the piezoelectric constant d31 in a low-frequency drive. Nevertheless, with a highfrequency drive as used in an inkjet head, it is clear that favorable piezoelectric properties can be obtained when the (100) face orientation degree is not less than 40% and not more than 70%. Equivalent results were given in a driving frequency of 30 kHz. Moreover, a piezoelectric element showing this type of orientation degree was manufactured when the thickness of the Pt layer in relation to the thickness of the entire lower electrode was 30 to 50%.

Further, the measurement of the piezoelectric constant d31 was sought from the displacement upon voltage application. Moreover, the expression "(100) face orientation degree" used herein implies the ratio to the sum of I(100) of I(100) and I(110) and I(111) when the diffraction intensity of the peak (2θ), which corresponds to the XYZ face upon utilizing the CuK beams in the X-ray diffraction angle method, is I(XYZ).

Second Embodiment

Figure 2:
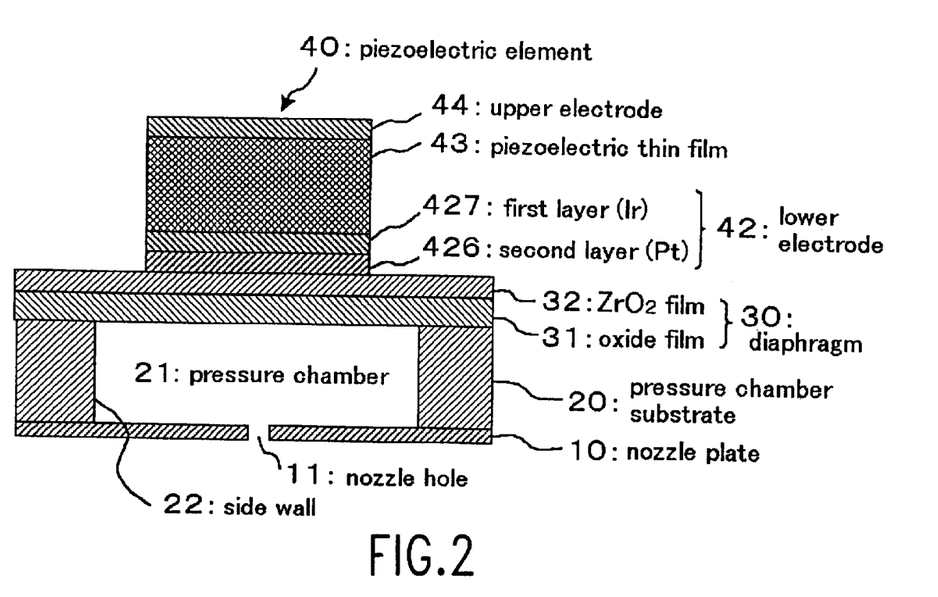
FIG. 2 is a cross section of a piezoelectric element according to the second embodiment.

FIG. 2 is a cross section showing the layer structure in which the piezoelectric element portion of the inkjet recording head according to the present embodiment is enlarged.

In the present embodiment, the lower electrode 42 differs from the aforementioned first embodiment in that it is structured from a second layer (lowermost layer) 426 containing Pt and having a thickness of not less than 30% and not more than 50% in relation to the thickness of the lower electrode 42, and a first layer (uppermost layer) 427 containing Ir. Similar advantages as with the first embodiment can be obtained with the lower electrode having the aforementioned structure.

Third Embodiment

Figure 3:
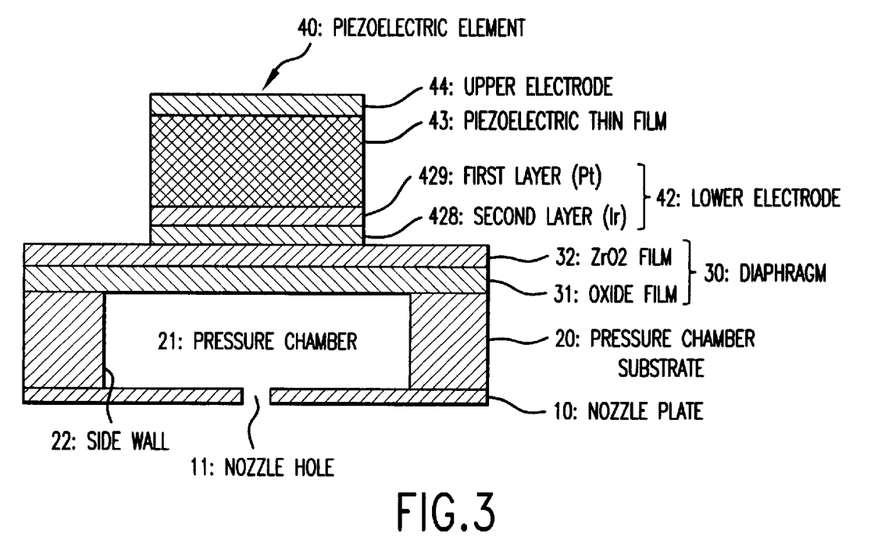
FIG. 3 is a cross section of a piezoelectric element according to the third embodiment.

FIG. 3 is a cross section showing the layer structure in which the piezoelectric element portion of the inkjet recording head according to the present embodiment is enlarged.

In the present embodiment, the lower electrode 42 differs from the aforementioned first embodiment in that it is structured from a second layer (lowermost layer) 428 containing Ir and having a thickness of not less than 20% and not more than 40% in relation to the thickness of the lower electrode 42, and a first layer (uppermost layer) 429 containing Pt. Similar advantages as with the first embodiment can be obtained with the lower electrode having the aforementioned structure.

Fourth Embodiment

In the fourth embodiment of the present invention, heat is applied from the lower electrode 42 side during the calcination step of the piezoelectric precursor film 43'. In other words, the thermal energy supplied from the lower electrode 42 side to the piezoelectric precursor film 43' is greater than the thermal energy supplied from the opposite side of the lower electrode 42.

Here, the lower electrode 42 has a laminate structure of iridium 20 nm/platinum 140 nm/iridium 20 nm from the diaph ragm 30 side. Moreover, a titanium layer (not shown) having a thickness 2 nm~20 nm is laminated on the lower electrode 42. Particularly, if such thickness is not less than 2 nm and not more than 10 nm, the piezoelectric thin film is preferentially oriented to the (100) face. Further, if such thickness is not less than 10 nm and not more than 20 nm, the piezoelectric thin film is preferentially oriented to the (111) face.

Figure 10:
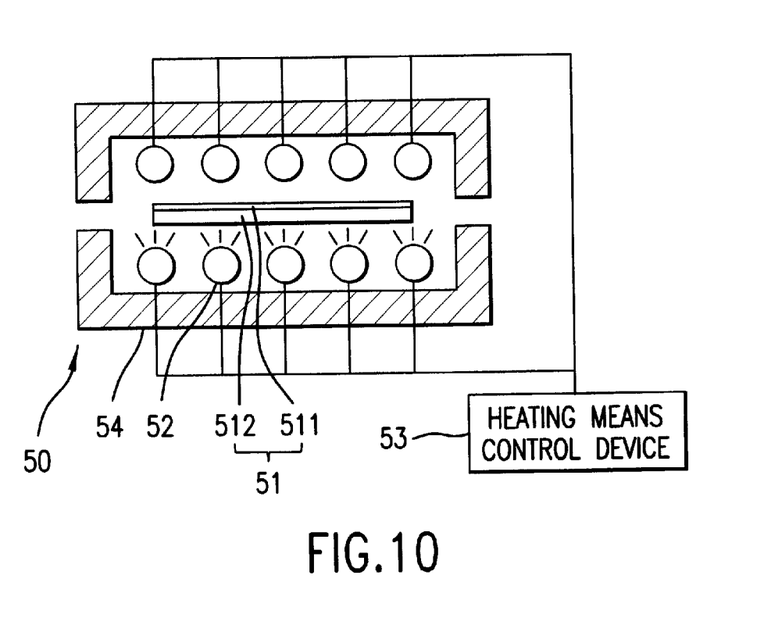
FIG. 10 is a conceptual diagram of an RTA device which is one example of a heating device.

FIG. 10 is a conceptual diagram of an RTA device which is one example of a heating device used in this heat treatment. The RTA device 50 is of a structure wherein a heating means 52 is arranged inside the device outer frame 54. The heating means 52 is made from the likes of a lamp capable of irradiating a sample 51 which is a substrate formed by laminating piezoelectric precursor films. A heating means controlling device 53 is connected to the heating means 52, and power to be supplied to the heating means 52 is controlled thereby.

When the heating means 52 is provided along the opposing two side walls of the device outer frame 54 as in this RTA device, only the heating means 52 along one wall (lower electrode side of the sample to be heated) will illuminate. For example, as shown in FIG. 10, when arranging the face 511 of the piezoelectric precursor film side of the sample 51 at the upper part of the diagram and the face 512 of the lower electrode side at the lower part of the diagram, only the heating means 52 at the lower part of the diagram will illuminate.

Furthermore, as it will suffice to heat the sample from one face thereof in order to achieve the object of the present invention, in addition to the RTA device, the heating means 52 may only be provided on one of the side walls. Moreover, the retaining portion (not shown) for retaining the substrate in the RTA device may be arranged so as to retain the substrate toward a fixed direction such that the face of the lower electrode side of the substrate faces the heating means provided to only one of the side walls. This enables the operation of setting the substrate inside the RTA device to be conducted without error and in an efficient manner.

Figure 11:
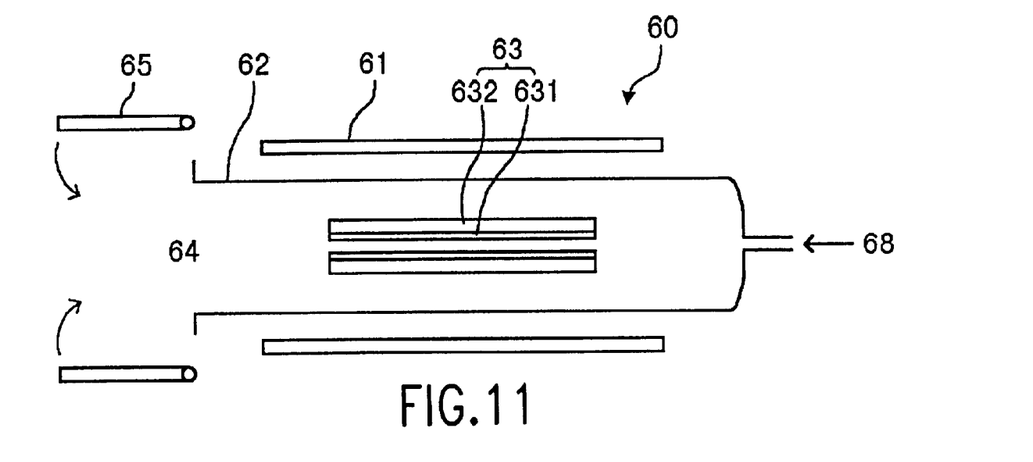
FIG. 11 is a conceptual diagram of a horizontal diffusion furnace which is another example of a heating device.

FIG. 11 is a conceptual diagram of a horizontal diffusion furnace which is another example of a heating device to be used in the heat treatment. The horizontal diffusion furnace 60 comprises a tubular furnace core 62. The furnace core 62 comprises a furnace mouth 64 which is the entrance and exit for the sample, a shutter 65 which is the opening and closing flapper of the furnace mouth 64, and a reactive gas introduction hole 68. The horizontal diffusion furnace 60 further comprises around the furnace core a heater 61 for raising the temperature within the furnace.

As the radiant heat for heating the sample inside the diffusion furnace is generated from the entire wall face of the furnace core 62 surrounding the periphery of the sample, it is not possible to apply heat from only one side of the furnace interior. Thus, upon conducting heat treatment with the diffusion furnace, a plurality of substrates 63 are prepared, and the faces 631 on the amorphous side of each of the plurality of substrates are made to face each other and heated inside the heating device. It is thereby possible to apply heat from the face 632 on the lower electrode side of the substrate, and the thermal energy supplied from the lower electrode side to the amorphous film becomes larger than the thermal energy supplied from the other side of the lower electrode. Moreover, the retaining portion for retaining the substrates inside the diffusion furnace may be structured so as to retain the faces on the amorphous side of the plurality of substrates while facing each other. This enables the operation of setting the substrate inside the RTA device to be conducted without error and in an efficient manner.

As described above, by heating the substrate from the lower electrode side, the crystallization of the piezoelectric precursor film 43' begins from the lower electrode 42 side and progresses in the film-thickness direction, thereby realizing favorable crystallization. In addition, the fact that the silicon constituting the ink chamber substrate 20 hardly absorbs the radiant heat from the heating device and that the metal constituting the lower electrode 42 has high thermal conductivity also functions favorably in heating the piezoelectric precursor film 43' from the lower electrode side.

Example 4-1

A piezoelectric element was manufactured in accordance with the manufacturing method of the present embodiment. In particular, the thickness of the aforementioned titanium layer formed on the lower electrode 42 was set to 5 nm in order to control the piezoelectric thin film to be of a desired crystal orientation. In other words, the layer structure below the piezoelectric precursor layer 43' was made to be Ti 5 nm/Ir 20 nm/Pt 140 nm/Ir 20 nm/Ti 10 nm/$ZrO_2$ 400 nm. Upon crystallizing this substrate with heat treatment, the piezoelectric thin film is preferentially oriented toward the (100) face under the influence of the aforementioned layer structure. As a practical matter, the (100) face half value breadth of the piezoelectric thin film, which was obtained by applying heat from the lower electrode side, was measured with the X-ray diffraction angle method, and the piezoelectric constant of such piezoelectric thin film was also measured. As a result, the (100) face half value breadth was 0.178 degrees, and the piezoelectric constant was 145 pC/N.

Comparative Example 4-1

A sample comprising the same layer structure as with the aforementioned Example 4-1 was heated from the piezoelectric precursor film side and similar measurements were conducted. As a result, the (100) face half value breadth was 0.213 degrees, and the piezoelectric constant was 115 pC/N.

Upon comparing the aforementioned Example 4-1 and Comparative Example 4-1, it is clear that the (100) face half value breadth of a smaller value; that is, a less distorted crystal can be obtained by heating the sample from the lower electrode side. It is also clear that the piezoelectric constant is improved.

Example 4-2

Another piezoelectric element was manufactured in accordance with the manufacturing method of the present embodiment. In particular, the thickness of the aforementioned titanium layer formed on the lower electrode 42 was set to 15 nm in order to control the piezoelectric thin film to be of a desired crystal orientation. In other words, the layer structure below the piezoelectric precursor layer 43' was made to be Ti 15 nm/Ir 20 nm/Pt 140 nm/Ir 20 nm/Ti 10 nm/$ZrO_2$ 400 nm. Upon crystallizing this substrate with heat treatment, the piezoelectric thin film is preferentially oriented toward the (111) face under the influence of the aforementioned layer structure. As a practical matter, the (100) face half value breadth of the piezoelectric thin film, which was obtained by applying heat from the lower electrode side, was measured with the X-ray diffraction angle method, and the piezoelectric constant of such piezoelectric thin film when constituting an inkjet head was also measured. As a result, the (111) face half value breadth was 0.182 degrees, and the piezoelectric constant was 131 pC/N.

Comparative Example 4-2

A substrate comprising the same layer structure as with the aforementioned Example 4-2 was heated from the piezoelectric precursor film side and similar measurements were conducted. As a result, the (111) face half value breadth was 0.215 degrees, and the piezoelectric constant was 95 pC/N.

Upon comparing the aforementioned Example 4-2 and Comparative Example 4-2, it is clear that the (111) face half value breadth of a smaller value; that is, a less distorted crystal can be obtained by heating the sample from the lower electrode side. It is also clear that the piezoelectric constant is improved.

Distribution of Lead Atom Content

Figure 12:
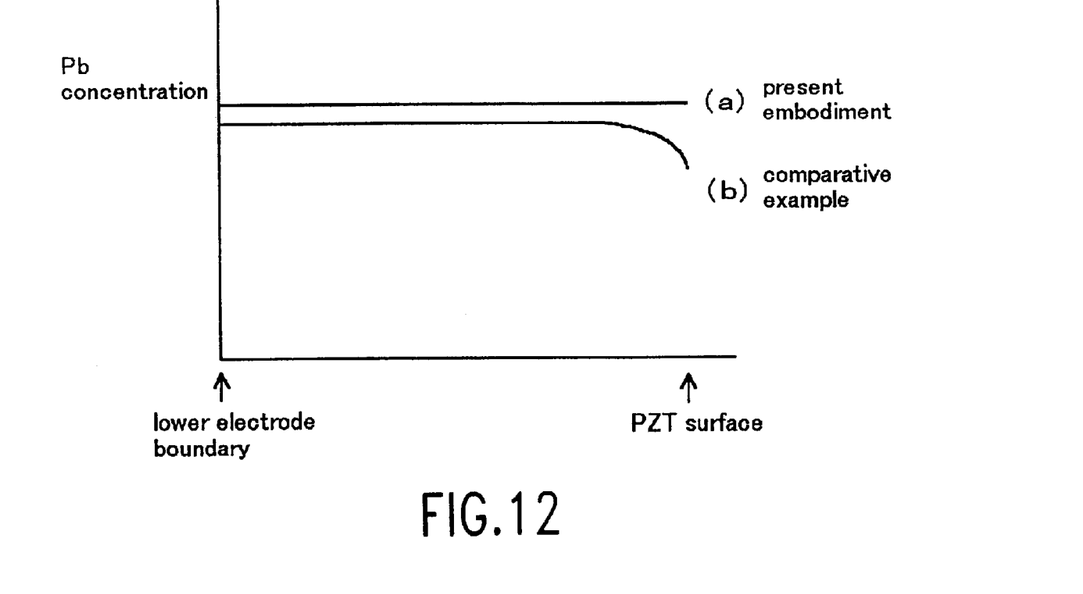
FIG. 12 is a graph showing the distribution of the lead atom content in the film-thickness direction of a PZT thin film manufactured with the respective methods illustrated in the fourth embodiment and the comparative examples.

The distribution of the lead atom content in the film-thickness direction of the PZT thin film obtained with the method described in the aforementioned fourth embodiment is illustrated with line (a) in FIG. 12. As the comparative example thereof, the distribution of the lead atom content in the film-thickness direction of the PZT thin film obtained by using the sol solution with the same components as in the aforementioned embodiment and applying heat from the precursor film side during the crystallization step is illustrated with line (b) in FIG. 12. As shown in the FIG. 12, with the manufacturing method in the comparative example, lead atoms are dispersed due to the heat and the lead ratio decreases. This tendency becomes prominent in the vicinity of the PZT surface. Contrarily, with the manufacturing method according to the present embodiment, the dispersion of lead is scarce and the lead ratio increases in comparison to the comparative example. Moreover, it is possible to prevent the unevenness of concentration caused by lead dispersing from the vicinity of the PZT surface. Accordingly, upon manufacturing a piezoelectric element with the method according to the present invention, it is possible to use sol liquid with little excess lead. Furthermore, this will lead to increased electric strength, less leaking current, and improved reliability.

Other Modification Examples

The present invention may be modified and adapted in various forms without restriction to the aforementioned embodiments. For instance, in addition to being adaptable as the piezoelectric element of the aforementioned inkjet recording head, the piezoelectric element manufactured according to the present invention can also be employed in the manufacture of non-volatile semiconductor memory devices, thin film condensers, pyroelectricity detectors, sensors, surface acoustic wave optical wave guides, optical memory devices, space optical modulators, ferroelectric devices such as a frequency duplicator for diode lasers, dielectric devices, pyroelectric devices, piezoelectric devices, and electro-optic devices.

What is claimed is:

1. A piezoelectric element, comprising:
   a lower electrode formed on a $ZrO_2$ film;
   a piezoelectric thin film formed on said lower electrode; and
   an upper electrode formed on said piezoelectric thin film, wherein the (100) face orientation degree of said piezoelectric thin film measured with the X-ray diffraction angle method is not less than 40% and not more than 70%.

2. A piezoelectric element according to claim 1, wherein the (110) face orientation degree of said piezoelectric thin film measured with the X-ray diffraction angle method is 10% or less, and the (111) face orientation degree of said piezoelectric thin film is the remaining portion thereof.

3. A piezoelectric element according to claim 1, further comprising:
   said lower electrode including,
     at least a first layer positioned as the uppermost layer and containing Ir, and
     a second layer positioned as the second uppermost layer and containing Pt, wherein the thickness of said second layer is not less than 30% and not more than 50% of the thickness of the entire lower electrode; and
   a Ti layer having a thickness of not less than 4 nm and not more than 6 nm formed on said lower electrode; and
   a piezoelectric thin film formed on said Ti layer.

4. A piezoelectric element according to claim 3, wherein said lower electrode further includes a third layer positioned, subsequent to said second layer, as the lowermost layer of said lower electrode and containing Ir.

5. A piezoelectric element according to claim 3, wherein said second layer containing Pt is the lowermost layer within said lower electrode.

6. A piezoelectric element according to claim 1, further comprising:
  said lower electrode including,
    at least a first layer positioned as the uppermost layer and containing Pt, and
    a second layer positioned as the second uppermost layer and containing Ir, wherein the thickness of said first layer is not less than 20% and not more than 40% of the thickness of the entire lower electrode;
    a Ti layer having a thickness of not less than 4 nm and not more than 6 nm formed on said lower electrode; and
    a piezoelectric thin film formed on said Ti layer.

7. A piezoelectric element according to claim 6, wherein said second layer containing Ir is the lowermost layer within said lower electrode.

8. An inkjet recording head, comprising:
  a nozzle plate having a plurality of nozzles;
  a pressure chamber substrate having a plurality of pressure chambers each of which is in communication with a respective nozzle of said nozzle plate;
  a diaphragm disposed on said pressure chamber substrate and having a $ZrO_2$ film; and
  a piezoelectric element including,
    a lower electrode formed on said $ZrO_2$ film of said diaphragm, including at least a first layer positioned as the uppermost layer and containing Ir, and a second layer positioned as the second uppermost layer and containing Pt, wherein the thickness of said second layer is not less than 30% and not more than 50% of the thickness of the entire lower electrode,
    a Ti layer having a thickness of not less than 4 nm and not more than 6 nm formed on said lower electrode, and
    a piezoelectric thin film formed on said Ti layer, and
    an upper electrode formed on said piezoelectric thin film, wherein the (100) face orientation degree of said piezoelectric thin film measured with the X-ray diffraction angle method is not less than 40% and not more than 70%, and wherein said piezoelectric element is provided as a piezoelectric actuator on said diaphragm.

9. A printer, comprising:
  a printer body; and
  an inkjet recording head located within said printer body, wherein said inkjet recording head is the printing means of the printer and includes,
    a nozzle plate having a plurality of nozzles,
    a pressure chamber substrate having a plurality of pressure chambers each of which is in communication with a respective nozzle of said nozzle plate,
    a diaphragm disposed on said pressure chamber substrate and having a $ZrO_2$ film, and
    a piezoelectric element including,
      a lower electrode formed on said $ZrO_2$ film of said diaphragm, including at least a first layer positioned as the uppermost layer and containing Ir, and a second layer positioned as the second uppermost layer and containing Pt, wherein the thickness of said second layer is not less than 30% and not more than 50% of the thickness of the entire lower electrode,
      a Ti layer having a thickness of not less than 4 nm and not more than 6 nm formed on said lower electrode, and
      a piezoelectric thin film formed on said Ti layer, and
      an upper electrode formed on said piezoelectric thin film, wherein the (100) face orientation degree of said piezoelectric thin film measured with the X-ray diffraction angle method is not less than 40% and not more than 70%, and wherein said piezoelectric element is provided as a piezoelectric actuator on said diaphragm.

10. A piezoelectric element comprising:
  a lower electrode;
  a PZT thin film formed on said lower electrode; and
  an upper electrode formed on said PZT thin film, wherein the (100) face half value breadth of said PZT thin film measured with the X-ray diffraction angle method is 0.2 degrees or less.

11. A piezoelectric element comprising:
  a lower electrode;
  a PZT thin film formed on said lower electrode; and
  an upper electrode formed on said PZT thin film, wherein the (111) face half value breadth of said PZT thin film measured with the X-ray diffraction angle method is 0.2 degrees or less.

12. A piezoelectric element comprising:
  a lower electrode;
  a PZT thin film formed on said lower electrode; and
  an upper electrode formed on said PZT thin film, wherein the content of lead (Pb) atom in said PZT thin film is fixed in the film-thickness direction.

13. A inkjet recording head, comprising:
  a nozzle plate having a plurality of nozzles;
  a pressure chamber substrate having a plurality of pressure chambers each of which is in communication with a respective nozzle of said nozzle plate;
  a diaphragm disposed on said pressure chamber substrate and having a $ZrO_2$ film; and
  a piezoelectric element including,
    a lower electrode formed on said $ZrO_2$ film of said diaphragm, including at least a first layer positioned as the uppermost layer and containing Pt, and a second layer positioned as the second uppermost layer and containing Ir, wherein the thickness of said first layer is not less than 20% and not more than 40% of the thickness of the entire lower electrode,
    a Ti layer having a thickness of not less than 4 nm and not more than 6 nm formed on said lower electrode,
    a piezoelectric thin film formed on said Ti layer, and
    an upper electrode formed on said piezoelectric thin film, wherein the (100) face orientation degree of said piezoelectric thin film measured with the X-ray diffraction angle method is not less than 40% and not more than 70%, and wherein said piezoelectric element is provided as a piezoelectric actuator on said diaphragm.

14. A printer, comprising:
  a printer body; and
  an inkjet recording head located within said printer body, wherein said inkjet recording head is the printing means of the printer and includes, a nozzle plate having a plurality of nozzles,
a pressure chamber substrate having a plurality of pressure chambers each of which is in communication with a respective nozzle of said nozzle plate,
a diaphragm disposed on said pressure chamber substrate and having a $ZrO_2$ film, and
a piezoelectric element including,
   a lower electrode formed on said $ZrO_2$ film of said diaphragm, including at least a first layer positioned as the uppermost layer and containing Pt, and a second layer positioned as the second uppermost layer and containing Ir, wherein the thickness of said first layer is not less than 20% and not more than 40% of the thickness of the entire lower electrode,
   a Ti layer having a thickness of not less than 4 nm and not more than 6 nm formed on said lower electrode,
   a piezoelectric thin film formed on said Ti layer, and
   an upper electrode formed on said piezoelectric thin film, wherein the (100) face orientation degree of said piezoelectric thin film measured with the X-ray diffraction angle method is not less than 40% and not more than 70%, and wherein said piezoelectric element is provided as a piezoelectric actuator on said diaphragm.

15. An inkjet recording head comprising:
a nozzle plate having a plurality of nozzles;
a pressure chamber substrate having a plurality of pressure chambers each of which is in communication with a respective nozzle of said nozzle plate;
a diaphragm disposed on said pressure chamber substrate;
a piezoelectric element including,
   a lower electrode,
   a PZT thin film formed on said lower electrode, and
   an upper electrode formed on said PZT thin film, wherein the (100) face half value breadth of said PZT thin film measured with the X-ray diffraction angle method is 0.2 degrees or less; and
an ink chamber on said pressure chamber substrate in which the internal capacity of said ink chamber changes in accordance with the mechanical displacement of said piezoelectric element.

16. A printer, comprising:
a printer body; and
an inkjet recording head located within said printer body, wherein said inkjet recording head is the printing means of the printer and includes,
   a nozzle plate having a plurality of nozzles,
   a pressure chamber substrate having a plurality of pressure chambers each of which is in communication with a respective nozzle of said nozzle plate,
   a diaphragm disposed on said pressure chamber substrate,
   a piezoelectric element including,
      a lower electrode,
      a PZT thin film formed on said lower electrode, and
      an upper electrode formed on said PZT thin film, wherein the (100) face half value breadth of said PZT thin film measured with the X-ray diffraction angle method is 0.2 degrees or less, and
   an ink chamber on said pressure chamber substrate in which the internal capacity of said ink chamber changes in accordance with the mechanical displacement of said piezoelectric element.

17. An inkjet recording head comprising:
a nozzle plate having a plurality of nozzles;
a pressure chamber substrate having a plurality of pressure chambers each of which is in communication with a respective nozzle of said nozzle plate;
a diaphragm disposed on said pressure chamber substrate;
a piezoelectric element including,
   a lower electrode,
   a PZT thin film formed on said lower electrode, and
   an upper electrode formed on said PZT thin film, wherein the (111) face half value breadth of said PZT thin film measured with the X-ray diffraction angle method is 0.2 degrees or less; and
an ink chamber on said pressure chamber substrate in which the internal capacity of said ink chamber changes in accordance with the mechanical displacement of said piezoelectric element.

18. A printer, comprising:
a printer body; and
an inkjet recording head located within said printer body, wherein said inkjet recording head is the printing means of the printer and includes,
   a nozzle plate having a plurality of nozzles,
   a pressure chamber substrate having a plurality of pressure chambers each of which is in communication with a respective nozzle of said nozzle plate,
   a diaphragm disposed on said pressure chamber substrate,
   a piezoelectric element including,
      a lower electrode,
      a PZT thin film formed on said lower electrode, and
      an upper electrode formed on said PZT thin film, wherein the (111) face half value breadth of said PZT thin film measured with the X-ray diffraction angle method is 0.2 degrees or less, and
   an ink chamber on said pressure chamber substrate in which the internal capacity of said ink chamber changes in accordance with the mechanical displacement of said piezoelectric element.

19. An inkjet recording head comprising:
a nozzle plate having a plurality of nozzles;
a pressure chamber substrate having a plurality of pressure chambers each of which is in communication with a respective nozzle of said nozzle plate;
a diaphragm disposed on said pressure chamber substrate;
a piezoelectric element including,
   a lower electrode,
   a PZT thin film formed on said lower electrode, and
   an upper electrode formed on said PZT thin film, wherein the content of lead (Pb) atom in said PZT thin film is fixed in the film-thickness direction; and
an ink chamber on said pressure chamber substrate in which the internal capacity of said ink chamber changes in accordance with the mechanical displacement of said piezoelectric element.

20. A printer, comprising:
a printer body; and
an inkjet recording head located within said printer body, wherein said inkjet recording head is the printing means of the printer and includes,
   a nozzle plate having a plurality of nozzles,
   a pressure chamber substrate having a plurality of pressure chambers each of which is in communication with a respective nozzle of said nozzle plate,
   a diaphragm disposed on said pressure chamber substrate, a piezoelectric element including,
  a lower electrode,
  a PZT thin film formed on said lower electrode, and
  an upper electrode formed on said PZT thin film,
    wherein the content of lead (Pb) atom in said PZT thin film is fixed in the film-thickness direction, and
  an ink chamber on said pressure chamber substrate in which the internal capacity of said ink chamber changes in accordance with the mechanical displacement of said piezoelectric element.

* * * * *